(12) United States Patent
Pyo

(10) Patent No.: US 6,376,356 B2
(45) Date of Patent: Apr. 23, 2002

(54) METHOD OF MANUFACTURING A METAL WIRING IN A SEMICONDUCTOR DEVICE

(75) Inventor: Sung Gyu Pyo, Ichon-Shi (KR)

(73) Assignee: Hyundai Electronics Industries Co. (KR)

( * ) Notice: Subject to any disclaimer, the term of this patent is extended or adjusted under 35 U.S.C. 154(b) by 0 days.

(21) Appl. No.: 09/875,621

(22) Filed: Jun. 6, 2001

(30) Foreign Application Priority Data

Jun. 20, 2000 (KR) .............................................. 00-33983

(51) Int. Cl.$^7$ ......................................... H01L 21/4763
(52) U.S. Cl. ....................... 438/618; 437/639; 437/641; 437/677; 257/751; 257/753
(58) Field of Search ................. 438/618–677, 438/687–688; 257/250–760

(56) References Cited

U.S. PATENT DOCUMENTS 6,309,957 B1 * 10/2001 Tu et al. ..................... 438/622
6,309,977 B1 * 10/2001 Ting et al. ................... 438/704

* cited by examiner

Primary Examiner—Jey Tsai
(74) Attorney, Agent, or Firm—Marshall Gerstein & Borun

(57) ABSTRACT

A method of manufacturing a metal wiring in a semiconductor device is disclosed. The method comprises forming a photosensitive film so that an underlying metal wiring can be exposed, adhering an chemical enhancer only to the underlying metal wiring, depositing a metal layer by CECVD method so that the metal layer is selectively deposited at the portion in which the chemical enhancer is formed, removing the photosensitive film and chemical enhancer, and forming a diffusion barrier layer spacer at the sidewall of the metal layer to form an upper metal wiring. Therefore, the disclosed method can solve poor contact with an underlying metal wiring due to shortage of processional margin in the process of forming an upper metal wiring in a high integration semiconductor device.

18 Claims, 3 Drawing Sheets

METHOD OF MANUFACTURING A METAL WIRING IN A SEMICONDUCTOR DEVICE

BACKGROUND OF THE INVENTION

1. Field of the Invention:

The invention relates generally to a method of manufacturing a metal wiring in a semiconductor device. More particularly, the present invention relates to a method of manufacturing a metal wiring in a semiconductor device capable of solving the problem of poor contact with an underlying metal wiring due to shortage of processional margin in the process of forming an upper metal wiring in a semiconductor device.

2. Description of the Prior Art:

A method of manufacturing a conventional metal wiring in a semiconductor device will be explained below by reference to FIGS. 1A to 1C.

Referring now to FIG. 1A, a first insulating film 12 is formed on a semiconductor substrate 11 in which a given structure is formed. Then, after a given region of the first insulating film 12 is etched, a metal layer is formed on the etched region of the first insulating film 12 and is then patterned, thus forming an underlying metal wiring 13. After a second insulating film 14 is formed on the entire structure, a given region of the second insulating film 14 is etched to form a via hole through which the underlying metal wiring 13 is exposed.

At this time, as the semiconductor device is higher integrated, an alignment problem of the underlying wiring and the upper wiring is inevitably generated during the lithography process of forming a via hole. Therefore, in order to reduce the operating speed of the device, the contact area between the via hole and the wiring must be reduced and the contact resistance must be increased. Also, as the second insulating film 14 is etched to form the via hole, if any of the second insulating film 14 is remained within the via hole, the via hole will not be electrically connected to the underlying wiring. In order to prevent this, the second insulating film 14 is over-etched, thus damaging the underlying wiring A.

Referring now to FIG. 1B, a diffusion barrier layer 15 and a seed layer 16 are sequentially formed on the entire structure including the via hole. Then, a metal layer 17 (e.g., a copper layer) is formed on the entire structure by electroplating method, so that the via hose can be buried. At this time, as the diffusion barrier layer 15 and the seed layer 16 are formed in the via hole in a wiring structure of an ultra-fin structure, space into which a metal layer is buried within the via hole is very reduced. Therefore, in the process of forming the seed layer 16 or of forming the metal layer 17, burial of the via hole is made impossible to cause a void B, thus lowering reliability of the device.

FIG. 1C is a cross-sectional view of the device in which an upper metal wiring is formed by exposing the second insulating film 14 by CMP process. The upper wiring is disconnected from the underlying wiring by the void B due to poor burial into the via hole having a large step coverage.

The problem in the above process is still severe in case of damascene process used to form a copper wiring. Therefore, there is a need for a technology capable of solving the problem.

SUMMARY OF THE DISCLOSURE

A method of manufacturing a metal wiring in a semiconductor device is disclosed which is capable of solving the problem of poor contact with an underlying metal wiring due to shortage of processional margin in the process of forming an upper metal wiring in a semiconductor device.

One disclose method of manufacturing a metal wiring in a semiconductor device comprises the steps of forming a photosensitive film on a semiconductor substrate in which a given structure including an underlying metal wiring is formed, and pattering the photosensitive film to expose the underlying metal wiring; performing a chemical enhancer process by which an chemical enhancer is adhered only to an exposed portion of the underlying metal wiring; depositing a metal layer by CECVD method, wherein the metal layer is selectively deposited at the portion in which the chemical enhancer is formed and the chemical enhancer is floated upwardly as the metal layer is deposited; removing the photosensitive film and the chemical enhancer and then forming a diffusion barrier layer spacer at the sidewall of said metal layer; and forming an insulating film on the entire structure to bury between-the metal layer.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PRESENTLY PREFERRED EMBODIMENTS

The disclosed methods will be described in detail by way of a preferred embodiment with reference to accompanying drawings. FIGS. 2A to 2D are cross-sectional views for explaining a method of manufacturing a metal wiring in a semiconductor device.

Figure 1A:
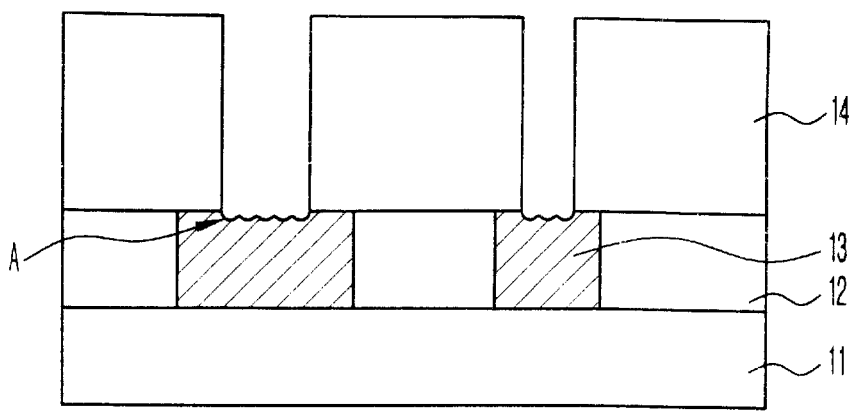
FIGS. 1A to 1C are cross-sectional views for explaining a method of manufacturing a conventional metal wiring in a semiconductor device.
Figure 1B:
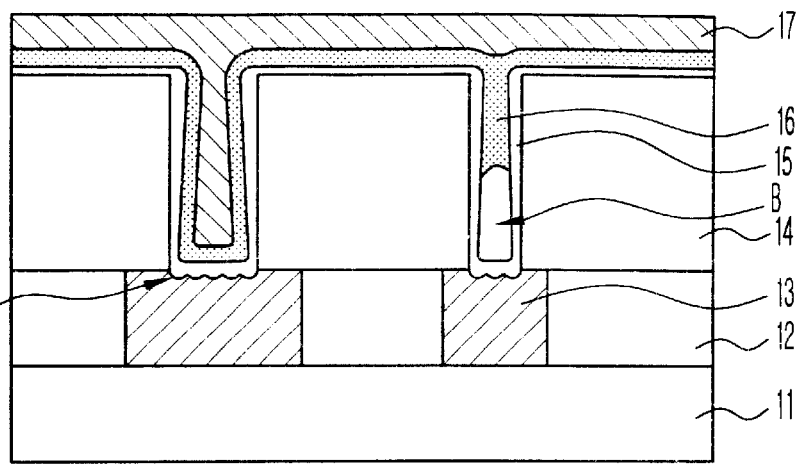
Figure 1C:
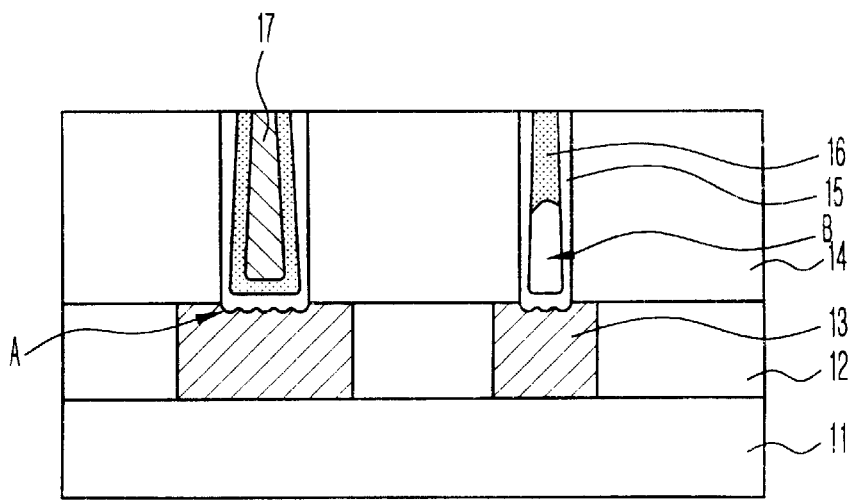
Figure 2A:
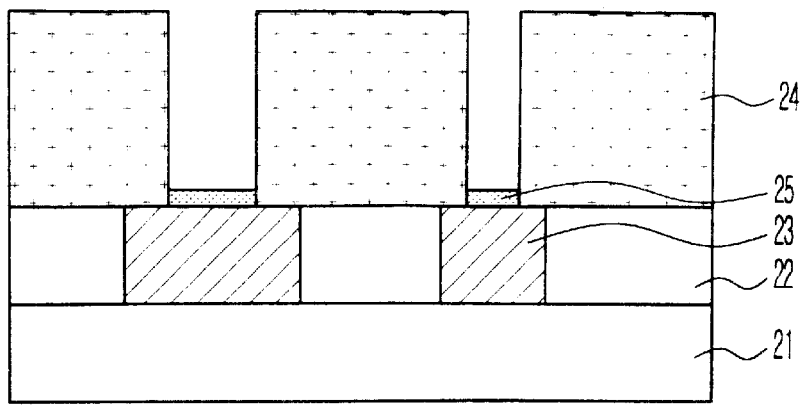
FIGS. 2A to 2D are cross-sectional views for explaining a method of manufacturing a metal wiring in a semiconductor device according to one disclose method.

Referring now to FIG. 2A, a first insulating film 22 is formed on a semiconductor substrate 21 in which a given structure is formed. Then, after a given region of the first insulating film 22 is etched, a metal layer is formed on the etched region of the first insulating film 22 and is then patterned, thus forming an underlying metal wiring 23. After a photosensitive film 24 is formed with the same thickness to a desired height of the wiring, a portion in which an upper wiring will be formed is patterned to expose a portion of the underlying wiring 23. Then, a chemical enhancer 25, which is selectively adhered only to the exposed portion of the underlying metal wiring 23 without adhering to the photosensitive film 24, is deposited. The chemical enhancer 25 may include iodine (I) containing liquid compounds, an enhancer of liquid state such as Hhfac1/2H$_2$O, Hhfac, TMVS, etc. or pure iodine (I$_2$) gas, iodine (I) containing gas and an enhancer of gas state such as water vapor. In addition to these, it may include chemical enhancers of liquid state or gas state of fluorine (F), chlorine (Cl), brome (Br), astatine (At) elements, being Group VII elements of the Periodic Table, and of liquid state or gas state of compounds thereof. The process using these chemical enhancers is performed at a temperature ranging from about −20° C. to about 300° C. for a time period ranging from about 1 second to about 10 minutes.

Figure 2B:
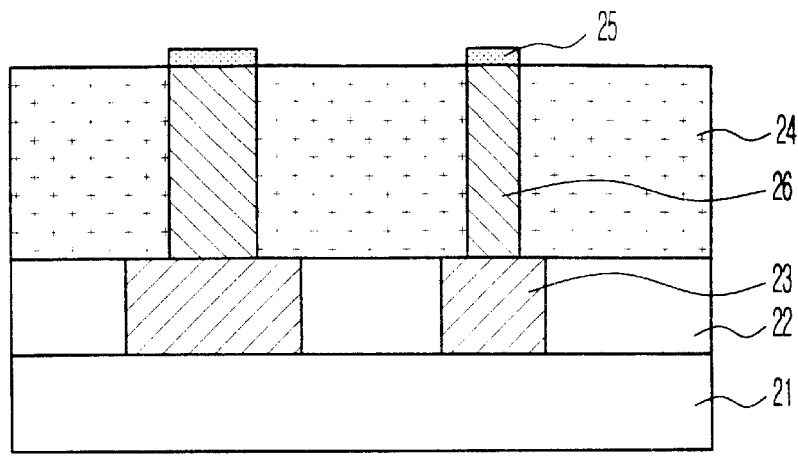

Referring now to FIG. 2b, a metal layer 26 is formed by means of chemically enhanced chemical vapor deposition (CECVD) method. Thereby, the metal layer 26 is selectively deposited on the portion in which the chemical enhancer 25 is formed. The chemical enhancer 25 is floated upwardly as the metal layer 26 is deposited. The metal layer 26 may be formed of titanium (Ti), aluminum (Al), copper (Cu), silver (Ag), etc. For example, if the metal layer 26 is formed of copper, all kinds of copper precursors including hfac of (hfac)CuVTMOS series, (hfac)CuDMB series and (hfac) CuTMVS series may be formed using a direct liquid injection (DLI), a control evaporation mixer (CEM) and all types of vaporizers of orifice and spray type, and may be also formed by means of MOCVD method using it. Also, if the metal layer 26 is formed by CECVD method, the temperature may range from about 50° C. to about 250° C. and the pressure may range from about 0.1 Torr to about 30 Torr and hydrogen ($H_2$), nitrogen ($N_2$), argon (Ar), or helium (He) or mixtures thereof are used as a pressurizing gas.

Figure 2C:
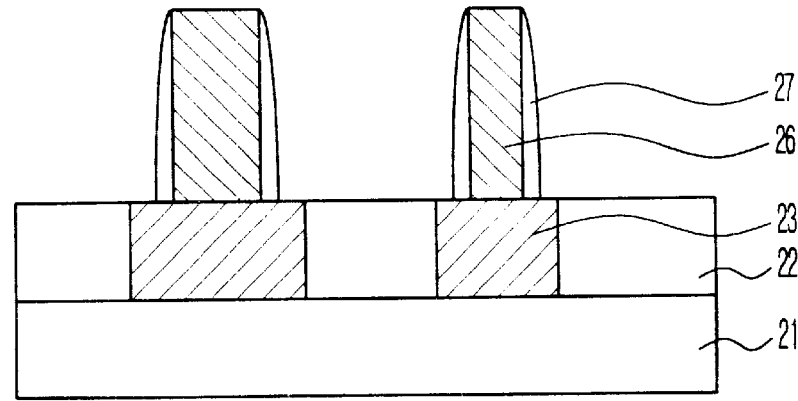

Referring now to FIG. 2C, the chemical enhancer 25 is removed while removing the photosensitive film 24, thus remaining only the metal layer 26. Then, a diffusion barrier layer 27 is formed on the entire structure. The diffusion barrier layer 27 is blanket-etched so that the diffusion barrier layer 27 can be formed in a spacer shape at the sidewall of the metal layer 26. The diffusion barrier layer 27 is formed, in a thickness ranging from about 5 Å to about 1000 Å, any one of a TiN film formed by ionized PVD method, CVD method or MOCVD method, a Ta film or a TaN film formed by ionized PVD method, a Ta film or a TaN film formed by CVD method, a WN film formed by CVD method, a TiAlN film, a TiSiN film or a TaSiN film formed by PVD method or CVD method.

Figure 2D:
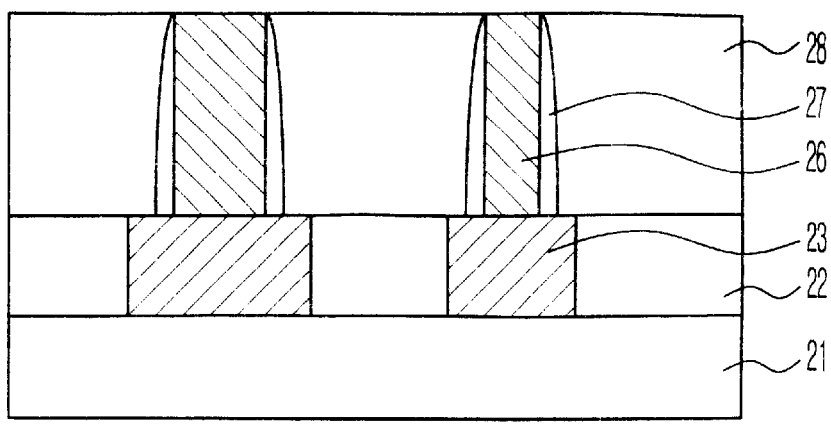

Referring now FIG. 2d, a second insulating film 28 is formed on the entire structure so that between-the upper wirings can be buried, thus completing a process of forming a metal wiring. The second insulating film 28 is formed of an oxide film or a film having a low dielectric constant.

As mentioned above, according to the disclosed methods, in processes for manufacturing semiconductor devices of an ultra-fine structure having a design rule of less than 0.10, the problem of reduced burial space within the pattern due to deposition of a diffusion barrier layer or a seed layer can be alleviated, thus facilitating burial of the wiring without any defects.

Further, in an ultra-fine structure using damascene, a diffusion barrier layer is usually formed using a CVD method or ALD. However, if the disclosed methods are applied, a PVD method can be employed without using the CVD method or the ALD method. Therefore, the disclosed methods have an outstanding advantage that they do not require a process of forming a seed layer using additional CVD method since the process can be significantly simplified.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed:

1. A method of manufacturing a metal wiring in a semiconductor device, comprising the steps of:

forming a photosensitive film on a semiconductor substrate in which a given structure including an underlying metal wiring is formed, and patterning said photosensitive film to expose said underlying metal wiring;

performing a chemical enhancer process by which an chemical enhancer is adhered only to an exposed portion of said underlying metal wiring;

depositing a metal layer by a CECVD method, wherein the metal layer is selectively deposited at the exposed portion in which said chemical enhancer is adhered and said chemical enhancer is floated upwardly as the metal layer is deposited;

removing said photosensitive film and said chemical enhancer and then forming a diffusion barrier layer spacer at the sidewall of said metal layer; and forming an insulating film on the entire structure.

2. The method of manufacturing a metal wiring in a semiconductor device according to claim 1, wherein said chemical enhancer process is performed using one of the gases selected from the group consisting of iodine (I) containing liquid compounds, Hhfac1/2$H_2$O, Hhfac, TMVS, pure iodine ($I_2$) gas, iodine (I) containing gas and water vapor.

3. The method of manufacturing a metal wiring in a semiconductor device according to claim 1, wherein said chemical enhancer process is performing using enhancers of liquid state or gas state and selected from the group consisting of fluorine (F), chlorine (Cl), bromine (Br), and astatine (At).

4. The method of manufacturing a metal wiring in a semiconductor device according to claim 1, wherein said chemical enhancer process is performed at a temperature ranging from about −20° C. to about 300° C. for a time period ranging from about 1 second to about 10 minutes.

5. The method of manufacturing a metal wiring in a semiconductor device according to claim 1, wherein said metal layer comprises a metal selected from the group consisting of titanium, aluminum, copper and silver.

6. The method of manufacturing a metal wiring in a semiconductor device according to claim 5, wherein said metal layer comprises copper is formed of a copper precursor selected from the group consisting of hfac of (hfac) CuVTMOS series, (hfac)CuDMB series and (hfac) CuTMVS series by use of DLI, CEM and a sprayer of orifice and spray type.

7. The method of manufacturing a metal wiring in a semiconductor device according to claim 1, wherein said metal layer is formed at a temperature ranging from about 50° C. to about 250° C. under a pressure ranging from 0.1 Torr to about 30 Torr.

8. The method of manufacturing a metal wiring in a semiconductor device according to claim 1, wherein said metal layer is formed using a pressurized gas selected from the group consisting of hydrogen, nitrogen, argon and helium.

9. The method of manufacturing a metal wiring in a semiconductor device according to claim 1, wherein said diffusion barrier layer spacer is formed by forming a TiN film formed by an ionized PVD method, a CVD method or a MOCVD method.

10. The method of manufacturing a metal wiring in a semiconductor device according to claim 1, wherein said diffusion barrier layer spacer is formed by forming a Ta film or a TaN film formed by ionized PVD method on said metal layer, and then by blanket-etching the film.

11. The method of manufacturing a metal wiring in a semiconductor device according to claim 1, wherein said diffusion barrier layer spacer is formed by forming a Ta film or a TaN film formed by CVD method, on said metal layer, and then by blanket-etching the film.

12. The method of manufacturing a metal wiring in a semiconductor device according to claim 1, wherein said diffusion barrier layer spacer is formed by forming a WN film formed by CVD method on said metal layer, and then by blanket-etching the film.

13. The method of manufacturing a metal wiring in a semiconductor device according to claim 1, wherein said diffusion barrier layer spacer is formed by forming a TiAlN film on said metal layer, and then by blanket-etching the film.

14. The method of manufacturing a metal wiring in a semiconductor device according to claim 1, wherein said diffusion barrier layer spacer is formed by forming a TiSiN film on said metal layer, and then by blanket-etching the film.

15. The method of manufacturing a metal wiring in a semiconductor device according to claim 1, wherein said diffusion barrier layer spacer is formed by forming a TaSiN film formed by PVD method or CVD method, on said metal layer, and then by blanket-etching it.

16. The method of manufacturing a metal wiring in a semiconductor device according to claim 1, wherein said diffusion barrier spacer has a thickness ranging from about 5 Å to about 1000 Å.

17. The method of manufacturing a metal wiring in a semiconductor device according to claim 1, wherein said insulating film comprises an oxide film or a film having a low dielectric constant.

18. A semiconductor device comprising metal wiring and being manufactured in accordance with the method of claim 1.

* * * * *